US012019113B2

(12) United States Patent
Haynes

(10) Patent No.: US 12,019,113 B2
(45) Date of Patent: Jun. 25, 2024

(54) HIGH IMPEDANCE FAULT DETECTOR

(71) Applicant: Aclara Technologies LLC, St. Louis, MO (US)

(72) Inventor: David Donald Haynes, St. Peters, MO (US)

(73) Assignee: Aclara Technologies LLC, St. Louis, MO (US)

( * ) Notice: Subject to any disclaimer, the term of this patent is extended or adjusted under 35 U.S.C. 154(b) by 6 days.

(21) Appl. No.: 17/167,956

(22) Filed: Feb. 4, 2021

(65) Prior Publication Data
US 2021/0247435 A1 Aug. 12, 2021

Related U.S. Application Data

(60) Provisional application No. 62/970,998, filed on Feb. 6, 2020.

(51) Int. Cl.
*G01R 31/08* (2020.01)
*H02H 1/00* (2006.01)

(52) U.S. Cl.
CPC ......... *G01R 31/085* (2013.01); *G01R 31/086* (2013.01); *H02H 1/0015* (2013.01)

(58) Field of Classification Search
CPC ............... G01R 31/085; G01R 31/086; G01R 19/2513; H02H 1/0015; H02H 3/162
See application file for complete search history.

(56) References Cited

U.S. PATENT DOCUMENTS 5,193,189 A * 3/1993 Flood .................. G05B 19/052
718/107
5,729,145 A 3/1998 Blades
(Continued)

FOREIGN PATENT DOCUMENTS

CA 2303964 C * 6/2004 ........... H01H 71/125
CN 108603911 A * 9/2018 ........... G01R 31/025
(Continued)

OTHER PUBLICATIONS

Pierre Bertrand, "Directional protection equipment", Cahier technique n° 181, 1998 (Year: 1998).*
(Continued)

*Primary Examiner* — Alexander Satanovsky
*Assistant Examiner* — Asm Fakhruddin
(74) *Attorney, Agent, or Firm* — Michael Best & Friedrich LLP

(57) ABSTRACT

An electrical grid system including a phase conductor, a neutral conductor, and a neutral-to-ground conductor configured to conduct current flow between the neutral conductor and a ground. The electrical grid system further includes a fault detection sensor including a current sensor configured to sense current flowing along the neutral-to-ground conductor. The fault detection sensor further includes a controller having an electronic processor that is configured to receive signals indicative of the current flowing through the neutral-to-ground conductor from the current sensor, monitor the received signals for an occurrence of an event associated with the current flowing along the neutral-to-ground conductor; and output an occurrence of a fault in the electrical grid system based on detecting occurrence of the event.

30 Claims, 4 Drawing Sheets

(56) References Cited

U.S. PATENT DOCUMENTS

| | | | |
|---|---|---|---|
| 5,982,593 | A | 11/1999 | Kimblin et al. |
| 6,072,317 | A | 6/2000 | Mackenzie |
| 8,537,508 | B2 | 9/2013 | Faxvog et al. |
| 2003/0043515 | A1* | 3/2003 | Brungs .................... H02H 9/08 361/42 |
| 2006/0176631 | A1* | 8/2006 | Cannon ................ H02H 1/0061 361/80 |
| 2007/0121268 | A1 | 5/2007 | Terhorst |
| 2008/0020627 | A1 | 1/2008 | Sexton et al. |
| 2010/0217546 | A1* | 8/2010 | Locker .................... G01R 29/16 702/58 |
| 2011/0063768 | A1 | 3/2011 | Sexton et al. |
| 2013/0169269 | A1 | 7/2013 | Bickel et al. |
| 2016/0266206 | A1 | 9/2016 | Thompson et al. |
| 2016/0365727 | A1* | 12/2016 | Kam ......................... H02J 3/26 |
| 2018/0034262 | A1 | 2/2018 | Simonin |

FOREIGN PATENT DOCUMENTS

| | | | | |
|---|---|---|---|---|
| EP | 1669767 | A1 * | 6/2006 | ........... G01R 31/086 |
| JP | 5494462 | B2 * | 5/2014 | ............. G01R 11/66 |
| KR | 101696220 | B1 * | 1/2017 | ........... G01R 31/024 |
| WO | 2015118163 | | 8/2015 | |

OTHER PUBLICATIONS

El-sherif, "Ground-fault protection—All you need to know," 2018 IEEE/IAS 54th Industrial and Commercial Power Systems Technical Conference (I&CPS), 2018, pp. 1-9 (Year: 2018).*

PCT/US2021/016645 International Search Report and Written Opinion dated Apr. 22, 2021 (20 pages).

Extended European Search Report dated Jan. 31, 2024 for corresponding European Application No. 21750590.8.

* cited by examiner

HIGH IMPEDANCE FAULT DETECTOR

RELATED APPLICATION

This application claims the benefit of U.S. Provisional Patent Application No. 62/970,998, filed Feb. 6, 2020, the entire content of which is hereby incorporated by reference.

FIELD

Embodiments relate to high impedance fault detection.

SUMMARY

The electrical grid system in the United States includes three-phase transmission lines that transport electricity from generation stations to distribution networks at voltages greater than or equal to 35 kilovolts (kV). Distribution networks within the electrical grid system typically include three-phase primary distribution lines and either three-phase or single-phase secondary distribution lines. Transformers at the distribution substations step down the voltage of electricity delivered to the distribution network to primary distribution voltage levels. Primary three-phase distribution lines, often referred to as medium voltage lines, typically distribute electricity that ranges in voltage between 2 kV-35 kV. Some customers in the distribution network, such as larger commercial or industrial facilities, may receive three-phase power directly from the transmission lines; however, smaller residential and commercial customers may receive power carried by distribution lines. Additional service transformers located at poles within the distribution network may be configured to step down the voltage of electricity carried by the distribution lines to low voltage levels (for example, 120-240V) to be distributed to customers at one or more service locations.

The three-phase transmission and distribution lines include phase conductors, or lines, and a neutral line. Distribution networks often utilize one of the three-phase primary lines (A, B, or C) and the neutral line to distribute single-phase electricity directly to customers or secondary distribution lines. In such instances, the neutral line serves as the return line for single-phase distribution. In a similar manner, one or more phase conductors and the neutral line on the secondary side of a transformer distribute low voltage electricity to customers. In such instances, the neutral line serves as a return current path to the service transformer.

The National Electrical Safety Code (NESC) requires distribution networks to include at least four connections to ground per every one mile of line, whether transmission or distribution, to comply with safety standards. In particular, it is customary of distribution networks within the United States to include at least four neutral to ground connections per every mile of distribution line as a means of providing an alternative return path for electricity distributed by phase conductor lines upon the occurrence of a fault. Under normal, non-fault operating conditions, a relatively standard amount of current flows freely between the ground and neutral line in a uniform direction along the neutral-to-ground (NG) wire; however, when a fault occurs in the distribution network, the direction and/or magnitude of current flowing through the NG wire may be reversed and/or increased or decreased respectively.

Faults within an electrical grid system may be caused by a variety of sources. For example, cable insulation, joint, and/or termination failures, contaminated insulators that flash-over, dielectric failures of electrical equipment, and/or digging into underground cables may cause electrical faults. Additional sources of faults within an electrical grid system may include tree limbs that fall onto, or rub against, overhead power supply lines, overhead power supply lines contacting each other during high winds, tilted distribution line poles, wildlife contacting energized conductors, and vehicle accidents with overhead poles or pad mounted distribution equipment.

Many of the faults that occur within electrical grid systems are low impedance faults, which may be detected due to large currents generated by a low impedance fault that occurs in a solidly grounded system. In contrast, another type of fault that may occur within an electrical grid system, a high impedance fault (HIF), is difficult to detect as high impedance faults draw low currents that may go undetected by conventional overcurrent protection equipment.

High impedance faults occur on the primary and secondary distribution lines within the distribution network and allow for current to flow from transmission and distribution lines into the ground, bypassing the load or intended neutral return line within an electrical grid system. Some high impedance faults that occur are more readily detected than others. For example, a high impedance caused by a downed power line may be accompanied by a power outage in the electrical grid system, which may quickly be detected by conventional fault detection systems and reported by an automated metering infrastructure (AMI) system.

In contrast, intermittent high impedance faults caused by, for example, recurring contact between power lines and overgrown vegetation, such as trees or bushes proximate the power lines, may not be accompanied by a power outage and go undetected by conventional fault detection systems. In such scenarios, power transferred from the distribution lines to the ground through the overgrown vegetation may result in the ignition of the vegetation and the spread of wildfire. In addition to intermittent high impedance faults caused by physical contact between power lines and vegetation, high impedance faults resulting from failed equipment in the electrical grid system may result in intermittent sparks and arcing capable of igniting vegetation or electrocuting people nearby.

In one aspect, the application provides an electrical grid system including a phase conductor, a neutral conductor, and a neutral-to-ground conductor configured to enable current flow between the neutral conductor and a ground. The electrical grid system further includes a fault detection sensor including a current sensor configured to sense current flowing along the neutral-to-ground conductor. The fault detection sensor further includes a controller having an electronic processor that is configured to receive signals indicative of the current flowing through the neutral-to-ground conductor from the current sensor, monitor the received signals for an occurrence of an event associated with the current flowing along the neutral-to-ground conductor; and output an occurrence of a fault in the electrical grid system based on detecting occurrence of the event.

In another aspect, the application provides a method for determining whether a fault has occurred in an electrical grid system comprising a phase conductor, a neutral conductor, a neutral-to-ground conductor configured to enable current flow between the neutral conductor and ground, and a fault detection sensor including a current sensor and a controller having an electronic processor. The method includes sensing, by the current sensor, current flowing along the neutral-to-ground conductor, receiving, by the controller having an electronic processor of the fault, signals indicative of the current flowing through the neutral-to-ground conductor from the current sensor, monitoring, by the controller, the received signals for an occurrence of an event associated the current flowing along the neutral-to-ground conductor, and reporting, by the controller, that a fault has occurred in the electrical grid system upon determining the event has occurred.

In another aspect, the application provides a fault detection sensor including a current sensor configured to sense current flowing along a neutral-to-ground conductor included in an electrical grid system and a controller having an electronic processor. The controller is configured to receive signals indicative of the current flowing through the neutral-to-ground conductor form the current sensor, monitor the received signals for an occurrence of an event associated with the current flowing along the neutral-to-ground conductor, and output an occurrence of a fault in the electrical grid system based on detecting occurrence of the event.

Before any embodiments are explained in detail, it is to be understood that the embodiments are not limited in their application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more processing units, such as a microprocessor and/or application specific integrated circuits ("ASICs"). As such, it should be noted that a plurality of hardware and software based devices, as well as a plurality of different structural components, may be utilized to implement the embodiments. For example, "servers," "computing devices," "controllers," "processors," etc., described in the specification can include one or more processing units, one or more computer-readable medium modules, one or more input/output interfaces, and various connections (e.g., a system bus) connecting the components.

Relative terminology, such as, for example, "about," "approximately," "substantially," etc., used in connection with a quantity or condition would be understood by those of ordinary skill to be inclusive of the stated value and has the meaning dictated by the context (e.g., the term includes at least the degree of error associated with the measurement accuracy, tolerances [e.g., manufacturing, assembly, use, etc.] associated with the particular value, etc.). Such terminology should also be considered as disclosing the range defined by the absolute values of the two endpoints. For example, the expression "from about 2 to about 4" also discloses the range "from 2 to 4". The relative terminology may refer to plus or minus a percentage (e.g., 1%, 5%, 10%, or more) of an indicated value.

Functionality described herein as being performed by one component may be performed by multiple components in a distributed manner. Likewise, functionality performed by multiple components may be consolidated and performed by a single component. Similarly, a component described as performing particular functionality may also perform additional functionality not described herein. For example, a device or structure that is "configured" in a certain way is configured in at least that way but may also be configured in ways that are not explicitly listed.

Other aspects of the invention will become apparent by consideration of the detailed description and accompanying drawings.

DETAILED DESCRIPTION

Figure 1:
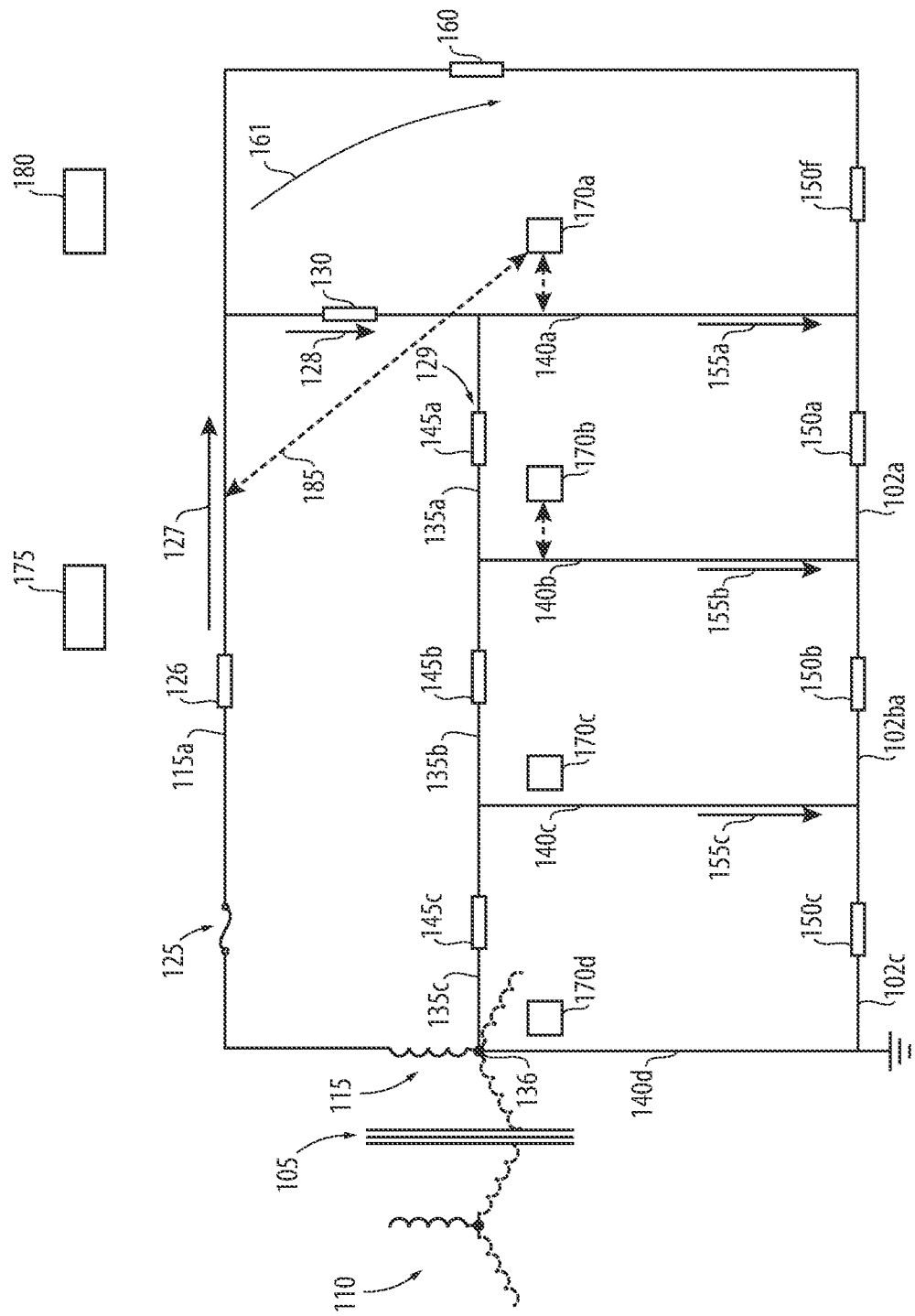
FIG. 1 illustrates a generalized schematic of an electrical grid system, according to some embodiments.

FIG. 1 illustrates an electrical grid system 100 according to some embodiments. The electrical grid system 100 is modeled as a resistive network including a ground 102, where the ground 102 is the actual ground (i.e. the soil, the rocks, the water, everything in and on the ground). The electrical grid system 100 includes a transformer 105 that may be configured to step down the voltage level from a higher voltage supplied by a primary side 110 of the transformer 105 to a lower voltage to be distributed by phase conductors 115. In some embodiments of the electrical grid system 100, the transformer 105 is a substation transformer that is configured to step down the voltage from a high voltage transmission level (for example, approximately 128 kV) to a medium voltage distribution level (for example, approximately 13 kV) to be distributed by phase conductors 115. In such embodiments, load impedance 130 may represent a service transformer. In some embodiments of the electrical grid system 100, transformer 105 may be a service transformer that is configured to step down voltage from a medium voltage level to a low voltage level (e.g. approximately 240V). In such embodiments, the load impedance 130 represents an individual "service." In some embodiments of electrical grid system 100, the transformer 105 is configured to step the voltage up from a medium voltage level to a high voltage level. In such embodiments, the phase conductors 115 are transmission lines, and the load impedance 130 is a substation transformer. Accordingly, it should be understood that the fault detection methods of the present application are described with respect to the electrical grid system 100 for exemplary purposes. Moreover, any of the fault detection methods described with respect to electrical grid system 100 may also be implemented in any of the embodiments described above and other embodiments not explicitly disclosed herein.

As shown in the embodiment of FIG. 1, the electrical grid system 100 includes phase conductor 115a having a switch 125 (or fuse) and line resistance 126. Line current 127 flows along the phase conductor 115a and is delivered to a node connected to the load impedance 130. Under normal, non-fault operating conditions, the line current 127 flows through the load impedance 130 as load current 128 and returns, as a return current 129, along neutral line 135 to a node 136. As discussed above, the NESC requires transmission and distribution networks to include four ground connections per every mile of line. Accordingly, the ground path 102 and neutral line 135 of electrical grid system 100 are segmented by numerous neutral-to-ground wires 140. In the illustrated example, four separate neutral-to-ground (NG) wires 140a-140d are shown. NG wires 140a-140d enable current to flow freely between the ground 102 and the neutral line 135.

Each neutral line segment 135a-135c includes a corresponding neutral line resistance 145a-145c, which have approximately equivalent resistance values (for example, approximately 0.33 Ohms per kilometer) under normal operating conditions of the electrical grid system 100. Similarly, each ground path segment 102a-102c has a corresponding ground path resistance 150a-150c; however, the resistance values of ground path resistances 150a-150c may vary depending on the geological characteristics of ground path segments 102a-102c. For example, if ground path segment 102a consists of rocky soil, the ground path resistance 150a may have a corresponding resistance value of approximately 100 Ohms per kilometer. Alternatively, if the ground path segment 102b consists of a lakebed, ground path resistance 150b may have a much smaller resistance value, for example, approximately 0.1 Ohms per kilometer. For exemplary purposes, it will be assumed that ground path segments 102a-102c of the electrical grid system 100 are composed of an approximately uniform geological makeup having ground path resistances 150a-150c that are equivalent and/or greater than the resistance of neutral line 135 (for example, approximately 100 Ohms per kilometer). Therefore, the neutral line 135 of the electrical grid system 100 has a smaller resistance than ground path 102.

Accordingly, under normal, non-fault operating conditions, the line current 127 flowing through the electrical grid system 100 flows through the load impedance 130 as load current 128 and returns along the neutral line 135 as return current 129. As the ground path 102 is in parallel with the neutral line 135, small amounts of neutral-to-ground current 155a-155c flow from the load impedance 130 and neutral line 135 to the ground path 102 along NG wires 140a-140c respectively. Thus, ground path 102 provides an additional return path for a portion of the line current 127.

In addition, the electrical grid system 100 includes a fault impedance 160; however, under normal, non-fault operating conditions, there is no current flow through the fault impedance 160 to ground 102. In contrast, upon the occurrence of a high impedance fault, such as a non-arcing ground fault caused by a downed phase conductor 115 or an arcing fault caused by failed equipment in the electrical grid system 100, a portion of the line current 127 may flow through the fault impedance 160 to ground 102, as indicated by fault current 161. When the fault impedance 160 in the electrical grid system 100 provides a path to ground 102 for the fault current 161, the fault current 161 may flow along a path of least resistance as it returns to node 136 at the transformer 105. Some of the fault current 161 may bypass ground path resistances 150 when returning to node 136 by flowing from the ground path 102 to the neutral line 135 through NG wires 140. Accordingly, the occurrence of a fault in the electrical grid system 100 may result in a reversal of the direction in which the neutral-to-ground current 155 flows. The flow of fault current 161 through NG wires 140 may additionally contribute to changes in magnitude and noise attributes of the NG current 155 flowing through NG wires 140.

The electrical grid system 100 further includes an advanced metering infrastructure (AMI) communications network including fault detection sensors 170a-170d, a headend device 175, and one or more AMI clients 180. Each fault detection sensor 170a-170d corresponds to a respective NG wire 140a-140d. As indicated by the dashed lines 185 extending from fault detection sensor 170a to the phase conductor 115a and the NG wire 140a, the fault detection sensor 170a is in electrical communication with the phase conductor 115a and NG wire 140a. However, depending on the location of NG wires 140 within the electrical grid system 100, it may not be possible for every fault detection sensor 170 to have access to the reference phase conductor 115a. Accordingly, as indicated by the dashed lines 185, fault detection sensor 170b is in electrical communication with NG wire 140b; however, fault detection sensor 170b is not in electrical communication with reference phase conductor 115a.

As will be discussed further below, the amount and/or variety of information associated with an operating condition of the electrical grid system 100 collected by a particular fault detection sensor 170 may be determined by whether the particular fault detection sensor 170 has access to a reference phase conductor 115. Moreover, fault detection sensors 170 that are not electrically connected to a reference phase conductor 115, such as fault detection sensor 170b, may be limited in ability to determine various fault scenarios within the electrical grid system 100 when compared to fault detection sensors 170 that are electrically connected to a reference phase conductor, such as fault detection sensor 170a. In some embodiments, a fault detection sensor 170 is mounted on a distribution pole within electrical grid system 100 that supports a phase conductor 115.

Figure 2:
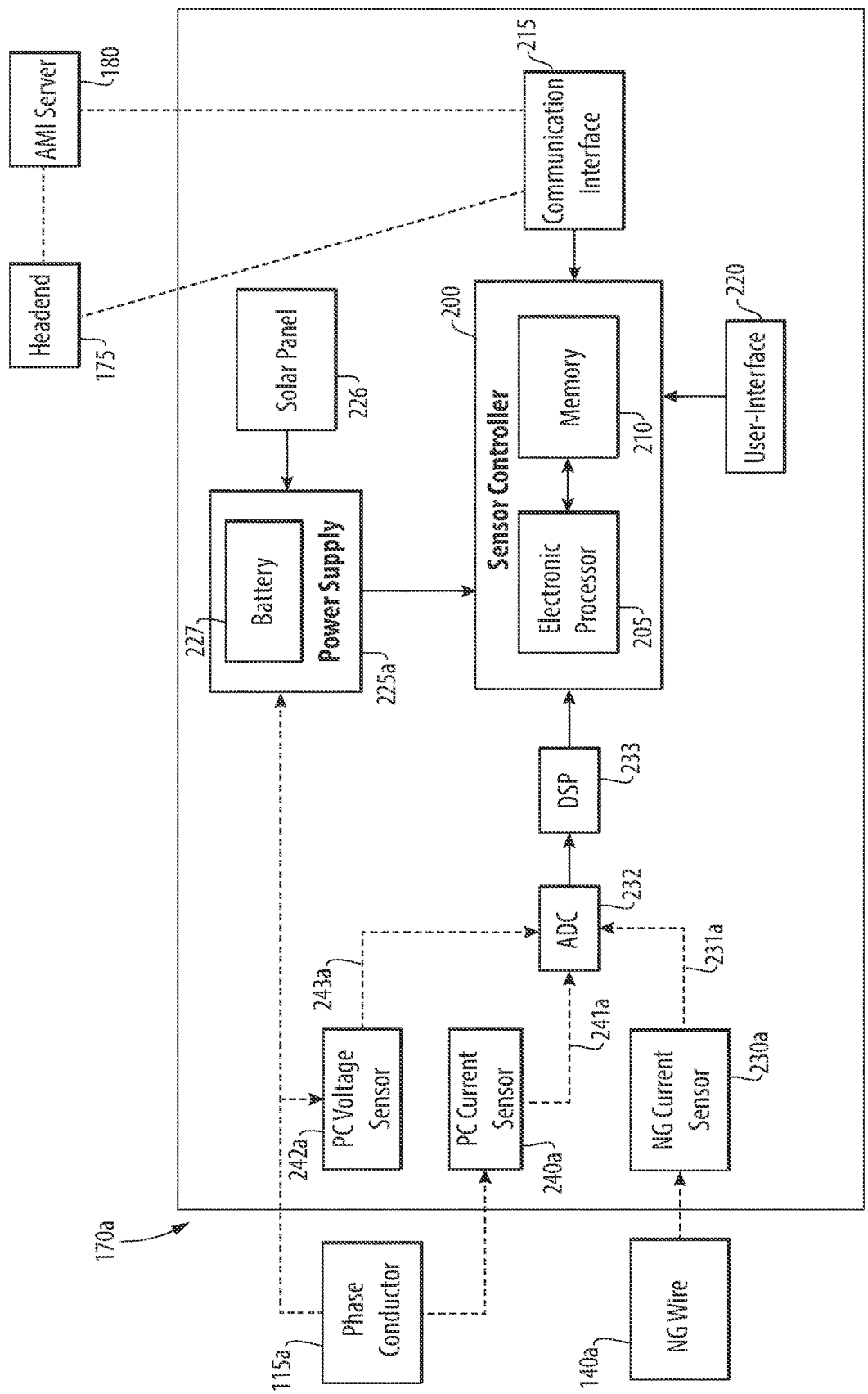
FIG. 2 illustrates a block diagram of a fault detection sensor, according to some embodiments.

FIG. 2 is a block diagram of the fault detection sensor 170a according to one embodiment. The fault detection sensor 170a may include a sensor controller 200 that is electrically and/or communicatively coupled to a variety of components of the fault detection sensor 170a and electrical grid system 100. In some embodiments, the sensor controller 200 includes a plurality of electrical and electronic components that provide power, operational control, and protection to the components within the fault detection sensor 170a and electrical grid system 100. For example, the sensor controller 200 may include, among other things, an electronic processor 205 (for example, a microprocessor or another suitable programmable device) and a memory 210.

The memory 210 includes, for example, a program storage area and a data storage area. The program storage area and the data storage area can include combinations of different types of memory, such as read-only memory (ROM) and random access memory (RAM). Various non-transitory computer readable media, for example, magnetic, optical, physical, or electronic memory may be used. The electronic processor 205 is communicatively coupled to the memory 210 and executes software instructions that are stored in the memory 210, or stored in another non-transitory computer readable medium such as another memory or a disc. The software may include one or more applications, program data, filters, rules, one or more program modules, fault detection algorithms, and other executable instructions that will be discussed in detail below.

The fault detection sensor 170a may further include a communication interface 215 that is electrically and/or communicatively coupled to sensor controller 200 and configured to provide communication between the fault detection sensor 170a and headend device 175 and one or more AMI clients 180 included in the AMI network. For example, the communication interface 215 may be configured to provide communication between the fault detection sensor 170a and the headend device 175, communication between the fault detection sensor 170a and an AMI client 180, where an AMI client 180 may be one or more additional external devices in the AMI network (for example, smartphones, tablets, laptops, etc.) In some embodiments, the communication interface 215 of the fault detection sensor 170a communicates wirelessly with the above-mentioned devices of the AMI network. In some embodiments, the communication interface 215 of the fault detection sensor 170a may communicate with the above-mentioned devices of the AMI network via wired communication methods that utilize wires, twisted pair cables, coaxial cables, and/or optical fiber cables. Those skilled in the art would understand that the AMI network may be replaced by other similar network types capable of scaling and communicating across long distances.

In some embodiments, the fault detection sensor 170a includes a user-interface 220 that may be configured to receive input from a service technician and/or output information to a service technician concerning the fault detection sensor 170a and/or electrical grid system 100. In some embodiments, the user-interface 220 includes a display (for example, a primary display, a secondary display, etc.) and/or input devices (for example, touch-screen displays, a plurality of knobs, dials, switches, buttons, etc.). The display may be, for example, a liquid crystal display ("LCD"), a light-emitting diode ("LED") display, an organic LED ("OLED") display, an electroluminescent display ("ELD"), a surface-conduction electron-emitter display ("SED"), a field emission display ("FED"), a thin-film transistor ("TFT") LCD, etc. The user-interface 220 is electrically and/or communicatively coupled to the sensor controller 200.

As illustrated in FIG. 2, the fault detection sensor 170a may further include a power supply 225a that is electrically and/or communicatively coupled to the sensor controller 200. The power supply 225a may be configured to selectively provide power to the various components of the fault detection sensor 170a. As the fault detection sensor 170a is in electrical communication with the phase conductor 115a, the power supply 225a may provide power to the various components of the fault detection sensor 170a from a variety of sources. For example, power supply 225a may power the various components of the fault detection sensor 170a with AC power received directly from the phase conductor 115a. In some embodiments, the power supply 225a includes one or more AC-AC converters configured to convert the AC power supplied by phase conductor 115a to a desired voltage before it is provided to the various components of the fault detection sensor 170a. In some embodiments, the power supply 225a includes one or more AC-DC converters that convert AC power supplied by phase conductor 115a into DC power that is supplied to the various components of the fault detection sensor 170a.

In some embodiments, the power supply 225a includes an additional power source, such as solar panel 226 or other type of renewable power source. In such embodiments, the power supply 225a may be configured to supply DC power directly from solar panel 226 to the various components of the fault detection sensor 170a. In some embodiments, the power supply 225a includes one or more DC-DC converters that are configured to convert the DC power supplied by the solar panel 226 to a desired voltage before it is provided to the various components of the fault detection sensor 170a. In other embodiments, the power supply 225a includes one or more DC-AC converters that are configured to convert the DC power supplied by the solar panel 226 to AC power that is then supplied to the various components of the fault detection sensor 170a.

The power supply 225a may further include a rechargeable battery 227 that is configured to provide power to the various components of the fault detection sensor 170. The rechargeable battery 227 may be charged by phase conductor 115a and/or solar panel 226. Moreover, the rechargeable battery 227 may be configured to be charged by the solar panel 226 during hours of sunlight and provide power to the various components of the fault detection sensor 170a when sunlight is not available. The rechargeable battery 227 may include one or more rechargeable battery cells having a lithium-ion or similar chemistry.

The fault detection sensor 170a may further include an NG current sensor 230a, which may be implemented as, for example, a current transformer. The NG current sensor 230a is configured to sense current flowing through the NG wire 140a. NG current signals 231a generated by the NG current sensor 230a are processed and monitored by the sensor controller 200, as will be discussed in detail further below. In some embodiments, NG current signals 231a generated by the NG current sensor 230a are processed by an analog-to-digital converter (ADC) 232 and a digital signal processor (DSP) 233 before being processed and monitored by the sensor controller 200. In some embodiments, the ADC 232 and the DSP 233 are individual components of the fault detection sensor 170a. In other embodiments, the functions of the ADC 232 and the DSP 233 are performed directly by the sensor controller 200. In some embodiments (not shown), the fault detection sensor 170a may additionally include an NG voltage sensor which may be implemented as, for example, a potential transformer.

As fault detection sensor 170a is electrically connected to the phase conductor 115a, the fault detection sensor 170a further includes a phase conductor (PC) current sensor 240a, which may be implemented as, for example, a current transformer. The PC current sensor 240a is configured to sense current flowing through the phase conductor 115a. In a manner similar to that of the NG current signals 231a generated by the NG current sensor 230a, PC current signals 241a generated by the PC current sensor 240a are processed and monitored by the sensor controller 200. The fault detection sensor 170a may additionally include a PC voltage sensor 242a, which may be implemented as, for example, a potential transformer. The PC voltage sensor 242a is configured to sense the voltage of phase conductor 115a. In a similar manner to the current signals discussed above, PC voltage measurements 243a generated by the PC voltage sensor 242a are processed and monitored by the sensor controller 200. In some embodiments, the fault detection sensor 170a may not include a PC voltage sensor 242a even when the fault detection sensor 170a has access to the phase conductor 115a. For example, fault detection sensor 170a may not include a PC voltage sensor 242a when included in an electrical grid system having high voltage phase conductors, such as a transmission network operating at more than approximately 35 kV. In some embodiments, fault detection sensor 170a may include additional sensors, such as an accelerometer, a temperature sensor, a humidity sensor, and/or other ambient environmental sensors.

Figure 3:
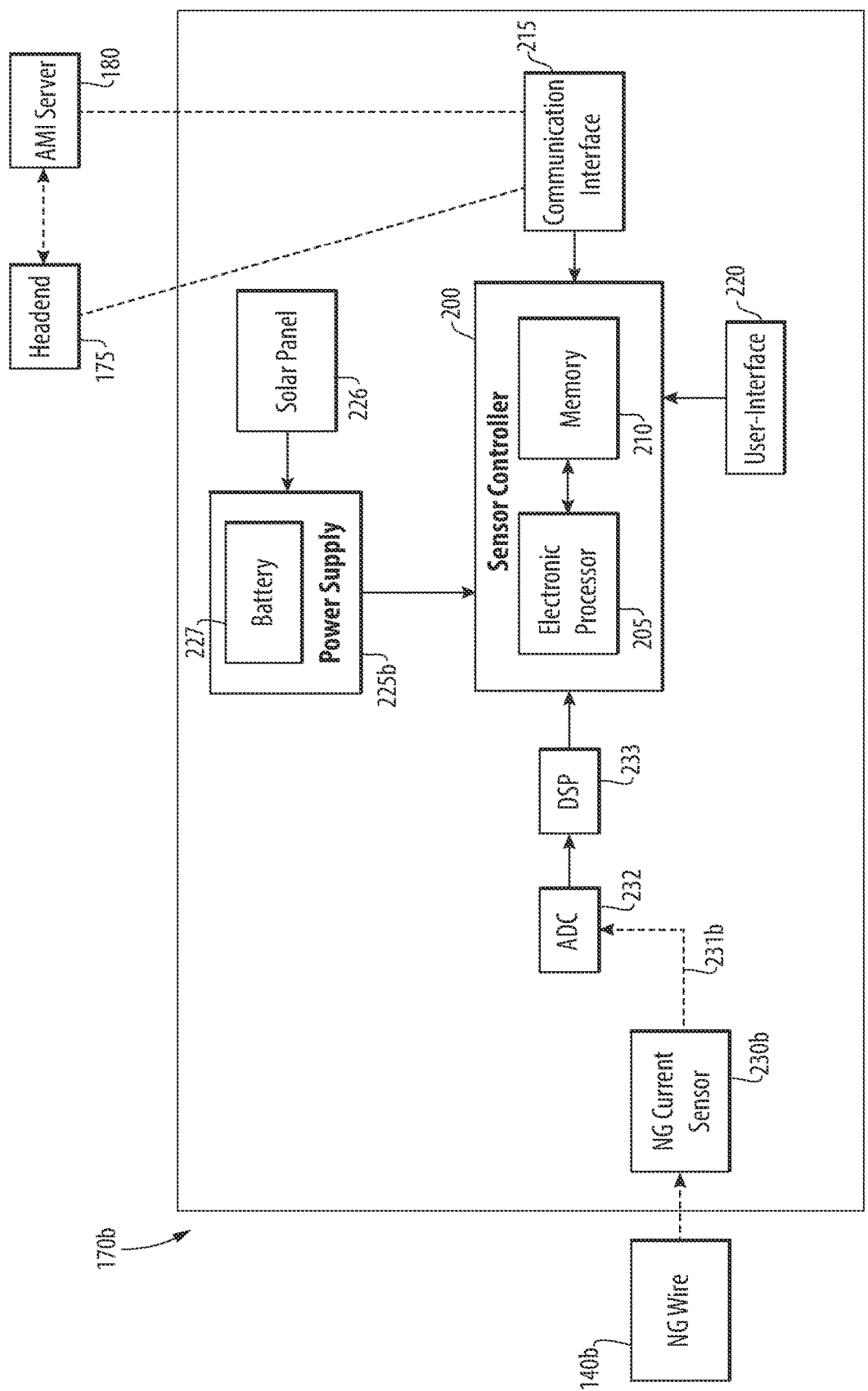
FIG. 3 illustrates a block diagram of a fault detection sensor, according to some embodiments.

FIG. 3 is a block diagram of the fault detection sensor 170b of electrical grid system 100 according to one embodiment. The fault detection sensor 170b may have a similar configuration to that of fault detection sensor 170a and may include many of the same components as are included in fault detection sensor 170a. However, as fault detection sensor 170b is not electrically connected to a phase conductor 115 in the electrical grid system 100, there is no need for fault detection sensor 170b to include a phase conductor current sensor and/or a phase conductor voltage sensor. Accordingly, in comparison to the fault detection sensor 170a, the fault detection sensor 170b provides for a less expensive fault detection sensor that may be deployed in locations limited in access to the phase conductors. In some embodiments, fault detection sensor 170b may include additional sensors, such as an accelerometer, a temperature sensor, a humidity sensor, and/or other ambient environmental sensors. The additional sensors may be used to provide additional indications of a fault, or a condition potentially related to a fault such as a wildfire, earthquake, and/or other environmental condition.

As discussed above, the fault detection sensors 170 may be configured to communicate with a headend device 175 in the AMI network. In some embodiments, the headend device 175 is a network management device located near one or more components of the electrical grid system. In some embodiments, the headend device 175 is a network management device located at a facility operated by a utility provider. In some embodiments, the headend device 175 is a cloud-based network management device. In some embodiments, the headend device 175 is configured to remotely configure the fault detection sensors 170. In some embodiments, the headend device 175 is configured to receive data associated with an operating condition of the electrical grid system 100 from the fault detection sensors 170. In some embodiments, the headend device 175 is configured to generate one or more alarms based on data received form the fault detection sensors 170.

During operation of the electrical grid system 100, a fault detection sensor 170 may be configured to monitor the NG current 155 flowing through an NG wire 140 for the occurrence of a fault. In particular, the sensor controller 200 of a fault detection sensor 170 is configured to receive NG current signals 231 that are indicative of the NG current 155 from the NG current sensor 230. The sensor controller 200 monitors the received NG current signals 231 for an occurrence of an event associated with the NG current 155 flowing through the NG wire 140, the event being indicative of a fault in the electrical grid system 100. Upon determining that the event associated with the NG current 155 has occurred, the sensor controller 200 may report the occurrence of a fault to the headend device 175 and/or some other AMI client 180. In some embodiments, the sensor controller 200 monitors the NG current 155 for the occurrence of one or more of a plurality of events associated with the NG current 155 flowing the NG wire 140. In such embodiments, the sensor controller 200 is configured to execute one or more fault detection algorithms used for detecting the occurrence of one or more of the plurality of events associated with the NG current 155 that is flowing through NG wire 140.

In some embodiments, the sensor controller 200 is configured to detect an occurrence of a first type event associated with the NG current 155 flowing through the NG wire 140 by executing a first fault detection algorithm. In such embodiments, the first type event may include a reversal in the direction in which the NG current 155 flows through the NG wire 140. In some embodiments, the sensor controller 200 may be configured to detect an occurrence of a second type event associated with the NG current 155 flowing through the NG wire 140 by executing a second fault detection algorithm. In such embodiments, the second type event may include an abnormality in the noise characteristic of the NG current 155 flowing through the NG wire 140, such as a presence of significant random noise. In some embodiments, the sensor controller 200 is configured to simultaneously execute the first and second fault detection algorithms.

Figure 4:
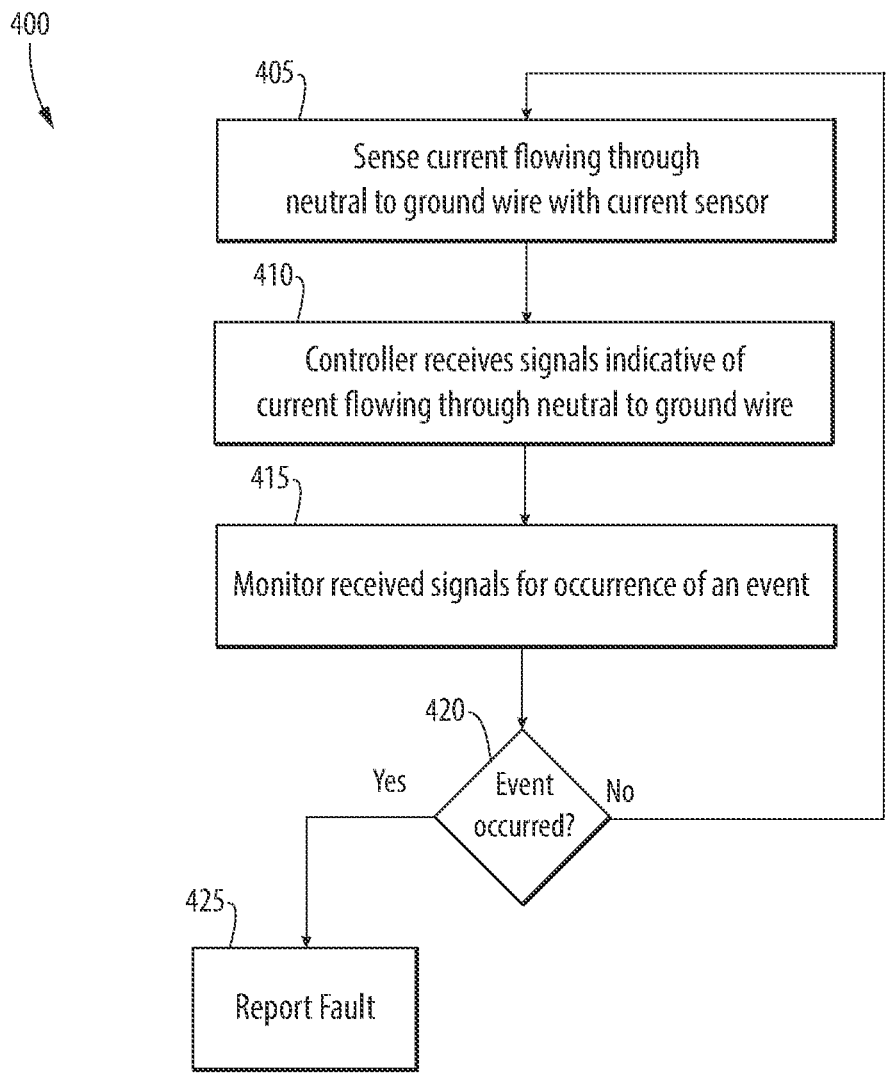
FIG. 4 illustrates a flowchart of a method for determining whether a fault has occurred in the electrical grid system, according to some embodiments.

FIG. 4 is a flowchart illustrating a process, or operation, 400 for determining whether a fault has occurred in the electrical grid system 100 according to one embodiment. It should be understood that additional steps may be added and not all of the steps may be required. Additionally, although illustrated as occurring sequentially, some of the steps may be performed in parallel. The NG current sensor 230a senses current flowing through the NG wire 140a (block 405). The sensor controller 200 receives current signals 231a generated by the current sensor 230a (block 410). The sensor controller 200 monitors the received current signals 231a for an occurrence of an event associated with the current flowing through NG wire 140a (block 415). Sensor controller 200 determines whether the event has occurred (block 420). If the event has occurred, the sensor controller 200 reports that a fault has occurred in the electrical grid system 100 (block 425). If the event has not occurred, the NG current sensor 230A continues to sense current flowing through the NG wire 140a (block 405).

As discussed above with reference to electrical grid system 100, electrical grid systems in which fault detection sensors 170 are implemented may have varying electrical characteristics. Thus, a first event associated with current flowing through an NG wire in a first electrical grid system may be indicative of the occurrence of a fault in the first electrical grid system; however, the occurrence of the same first event associated with current flowing through an NG wire of a second electrical grid system may not be indicative of an occurrence of a fault in the second electrical grid system. For example, a first electrical grid system 100a in which the ground path 102 is composed of highly resistive rock and soil may experience small NG currents 155 flowing through the NG wires 140 under normal, non-fault operating conditions of the first electrical grid system 100a. Accordingly, an occurrence of an event associated with the NG current 155 flowing through an NG wire 140, such as increase in the magnitude of the NG current 155 flowing through the NG wire 140 to a first value, may be indicative that a fault has occurred in the first electrical grid system 100a. However, if the ground path 102 of a second electrical grid system 100b (or the ground path at a different location within the first electrical grid system 100a), is composed of a highly conductive material, such as sediment in a lakebed or water, NG currents 155 having a magnitude equal to or greater than the first value may flow through NG wires 140 under normal, non-fault operating conditions. Moreover, even though an NG current 155 having a magnitude equal to the first value may indicate that a fault has occurred in the first electrical distribution 100a, the occurrence of NG current 155 having a magnitude equal to the first value flowing through an NG wire 140 of the second electrical grid system 100b would not necessarily be indicative of the occurrence of a fault within the second electrical grid system 100b. In other words, characteristics associated with NG currents 155, such as magnitude, noise power, and/or direction of flow may vary under normal, non-fault operating conditions depending on the environment in which the electrical grid system 100 is operating.

Before a fault detection sensor 170 can accurately detect whether the occurrence of an event associated with NG current 155 flowing through an NG wire 140 is indicative of a fault in the electrical grid system 100, the fault detection sensor 170 is configured to record baseline data indicative of characteristics of the NG current 155 flowing through the NG wire 140 during a period of time in which it is known that there are no faults occurring in the electrical grid system 100. Baseline data recorded by the fault detection sensor 170 may include, but is not limited to, an average magnitude of the NG current 155, a standard direction of flow of the NG current 155 (for example, from neutral to ground), an average noise characteristic associated with the NG current 155 on an NG wire 140 (for example, an average total harmonic distortion (THD), an average total random harmonic distortion (TRHD), etc. In some embodiments, the fault detection sensor 170 develops baseline data associated with NG current 155 flowing through the NG wire 140 over a predetermined time period (for example, one or more hours, one or more days, one or more weeks, one or more months, etc.). In some embodiments, the fault detection sensor 170 may be configured to develop new baseline data associated with NG current 155 flowing through the NG wire 140 to accommodate for environmental changes near the electrical grid system 100 in which it operates. For example, the fault detection sensor 170 may be configured to develop new baseline data associated with NG current 155 flowing through the NG wire 140 once per month, once per season, or once per year. In other embodiments, the fault detection sensor 170 may be configured to develop new baseline data associated with NG current 155 flowing through the NG wire 140 on demand, such as in response to a request from the headend device 175 or the AMI client 180. In addition, the fault detection sensor 170 is configured to store the baseline data in its memory 210. In some embodiments, the fault detection sensor 170 is configured to transmit the developed baseline data to the headend device 175 and/or AMI client 180. In such embodiments, the fault detection sensor 170 may transmit the developed baseline data to the headend device 175 and/or AMI client 180 upon request, after a self-normalization period, and/or periodically.

For example, with respect to electrical grid system 100 discussed above, under normal, non-fault operating conditions, the highly resistive rocky soil of the ground path 102 results in the flow of small NG currents 155 along the NG wires 140 in a direction from the neutral line 135 to the ground path 102. Thus, when fault detection sensor 170a begins a self-normalizing period in which it records baseline data associated with the NG current 155a flowing through NG wire 140a (for example, upon installation or request from the headend device 175), the fault detection sensor 170a may determine that an average magnitude of NG current 155a flowing through the NG wire 140a is equal to a first value (for example, 1 mA) when there are no faults occurring in the electrical grid system 100. In addition, as the fault detection sensor 170a is in electrical communication with the phase conductor 115a, the fault detection sensor 170a may reference the line current 127 flowing through phase conductor 115a to determine that the normal direction that NG current 155a flows through NG wire 140a is in a direction from the neutral line 135 to the ground 102. In particular, since the direction in which line current 127 flows along the phase conductor 115a is always known, the sensor controller 200 of fault detection sensor 170a may compare NG current signals 231a received from NG current sensor 230a to the PC current signals 241a received from the PC current sensor 240a to determine whether NG current 155a is flowing in the normal direction along NG wire 140a.

As discussed above, after gathering baseline data associated with non-fault characteristics of NG current 155a flowing through the NG wire 140a, the fault detection sensor 170a is operable to detect the occurrence of one or more events associated with NG current 155a that are indicative of the occurrence of one or more faults in the electrical grid system 100. Reference is now made to the detection of the first type event associated with NG current 155a flowing along NG wire 140a, which includes a reversal in the direction of flow of NG current 155a. The fault detection sensor 170a is operable to determine that a fault in the electrical grid system 100 has occurred upon detecting NG current 155a flowing in the reverse direction, wherein the reverse direction is opposite of the normal direction determined during the self-normalizing period. In particular, the fault detection sensor 170a may determine that a high impedance ground fault, such as a downed overhead phase conductor 115 or the presence of a fault impedance 160 providing a path for the line current 127 to flow from the phase conductor 115a to the ground 102, is occurring in the electrical grid system 100. In addition, the first event associated with NG current 155a flowing the NG wire 140a may include an increase in magnitude of the NG current 155a.

For example, an overgrown tree proximate the phase conductor 115a may be modeled as fault impedance 160 within the electrical grid system 100. If the overgrown tree 160 falls or leans on the phase conductor 115a carrying a line current 127, a large portion of the line current 127, illustrated as fault current 161, will bypass the load impedance 130 and flow through the overgrown tree 160 to ground 102. The fault current 161 exiting the overgrown tree 160 then flows through the ground path 102 as it returns to the node 136 at transformer 105. As discussed above, the ground path 102 of electrical grid system 100 has a much higher resistance than that of the neutral line 135. Accordingly, the fault current 161 flowing through ground path 102 will tend to take the path of least resistance as it returns to node 136 by flowing from the ground path 102 to the neutral line 135 through the NG wires 140, such as NG wire 140a. Therefore, the direction in which NG current 155a flows along NG wire 140a will reverse from the normal neutral-to-ground direction and, instead, flow in a ground-to-neutral direction. In addition, the magnitude of NG current 155a may sharply increase as fault current 161 flows into the NG wire 140a. Accordingly, fault detection sensor 170a will detect the reversal in flow, and corresponding change in magnitude, of NG current 155a and may report the occurrence of the ground fault to the headend device 175 and/or AMI client 180 using peer-to-peer connection.

Although a change in magnitude and reversal in the direction of NG current 155a may be a strong indication of the occurrence of a high impedance ground fault within electrical grid system 100, there may be additional causes for NG current 155a to reverse flow direction and/or change magnitude that are not attributed to faults within the electrical grid system. For example, a power outage or restoration within electrical grid system 100 may cause a considerable instantaneous rise in magnitude and/or change in flow direction of NG current 155a flowing through NG wire 140a. In addition, environmental events such as rainfall or geological changes in the ground path 102 may result in a slow, but dramatic change in the magnitude, and possibly direction of flow, of NG current 155a. It is undesirable for the fault detection sensor 170a to determine that a fault has occurred in the electrical grid system 100 based on detecting the occurrence of an event, such as magnitude increase and/or flow reversal, associated with NG current 155a if the event is caused by a non-fault condition as described above. Thus, the fault detection sensor 170a may be configured to execute a first fault detection algorithm used for detecting changes in the direction of flow and magnitude of NG current 155a that are caused by faults within the electrical grid system 100. The first fault detection algorithm is additionally used to filter out detected changes in the NG current 155a, such as a single instantaneous step-up or gradual changes in magnitude, that may be attributed to the non-fault conditions described above. For exemplary purposes, the first fault detection algorithm is explained with respect to fault detection sensor 170a.

In some embodiments, the first fault detection algorithm is executed by fault detection sensors 170 that are in electrical communication with a phase conductor 115, such as fault detection sensor 170a. In such embodiments, during the execution of the first fault detection algorithm, the sensor controller 200 of fault detection sensor 170a is configured to simultaneously monitor the NG current signals 231a received from the NG current sensor 230a and PC current signals 241a received from the PC current sensor 240a. While monitoring the received current signals, the sensor controller 200 compares the direction of flow of NG current 155a to the known flow direction of line current 127 that is flowing through phase conductor 115a to determine whether the NG current 155a is flowing in the normal direction (from neutral line 135 to ground 102).

When the sensor controller 200 detects a reversal in the direction in which NG current 155a is flowing along NG wire 140a, the sensor controller 200 raises a first type event flag and initiates a fault timer. The fault timer continues to run, or elapse, when the NG current 155a is flowing through NG wire 140a in the reverse direction. If the sensor controller 200 determines that NG current 155a flows in the reverse direction along NG wire 140a for an amount of time that exceeds a predetermined fault threshold time (for example, 30 seconds), the sensor controller 200 determines that a fault (for example, a high impedance ground fault) is present in the electrical grid system 100. Accordingly, the fault detection sensor 170a may report the fault to the headend device 175 and/or AMI client 180 for further processing. If the headend device 175 and/or AMI client 180 determine that fault report is accurate, the headend device 175 and/or AMI client 180 may be configured to open the switch 125 in phase conductor 115a. Furthermore, the headend device 175 and/or AMI client 180 may report the location of the fault to utility service technicians.

In some embodiments, the first fault detection algorithm is executed by fault detection sensors 170 that are not in electrical communication with a phase conductor 115, such as fault detection sensor 170b, and/or fault detection sensors 170 that are in electrical communication with a phase conductor 115, such as fault detection sensor 170a. In such embodiments, while executing the first fault detection algorithm, the sensor controller 200 of fault detection sensor 170a is configured to monitor NG current signals 231a received from the NG current sensor 230a for changes in magnitude of the NG current 155a flowing through NG wire 140a. In particular, the sensor controller 200 compares a present magnitude value of the NG current 155a to a previous magnitude value of the NG current 155a. An updated present value of NG current 155a's magnitude may be determined at a configurable rate. For example, the present magnitude value of NG current 155a may be updated continually to be the average magnitude of NG current 155a over one sample period (for example, one sample period may be approximately one second and include a predetermined amount of NG current 155a sample cycles, such as 60). Moreover, the updated present magnitude value of NG current 155a is updated by the sensor controller 200 after the passing of each sample period. In addition, the previous magnitude value of NG current 155a is updated continually to accommodate a moving average of a configurable amount of previous magnitude values of NG current 155a. For example, the moving average of previous magnitude values of NG current 155a may be determined as an average of the magnitude values of NG current 155a over the previous two sample periods.

If the sensor controller 200 determines that the present magnitude value of NG current 155a differs from the moving average of previous magnitude values of NG current 155a by a configurable change threshold (for example, approximately 1 amp), a first type event flag is raised by sensor controller 200. Upon raising the first type event flag, the sensor controller 200 compares the present magnitude value of the NG current 155a to a baseline average magnitude value of the NG current 155a that was previously determined during a self-normalization period of the fault detection sensor 170a. If the present magnitude value of the NG current 155a differs from the baseline average magnitude value of NG current 155a by a predetermined threshold amount (for example, approximately 2 amps), the sensor controller 200 initiates a fault timer. The fault timer continues to run when the present magnitude value of NG current 155a differs from the baseline average magnitude value of NG current 155a by the predetermined threshold amount. In other words, if the present magnitude value of NG current 155a does not differ from the baseline average magnitude value of NG current 155a by the predetermined threshold amount, the sensor controller 200 stops the fault timer.

The sensor controller 200 continuously compares an updated present magnitude value of NG current 155a to the baseline average magnitude value of NG current 155a when the fault timer is running. If the present magnitude value of NG current 155a differs from the baseline average magnitude value of NG current 155a for a predetermined fault threshold time (for example, approximately 5 seconds), the sensor controller 200 determines that a fault (for example, a high impedance ground fault) is present in the electrical grid system 100. That is, when the magnitude of current 155a flowing through NG wire 140a experiences a sharp increase or decrease, and the increased/decreased magnitude value is maintained for an extended period of time, the fault detection sensor 170a determines that a fault has occurred in the electrical grid system 100. Accordingly, the fault detection sensor 170a reports the fault to the headend device 175 and/or AMI client 180 for further processing. If the headend device 175 and/or AMI client 180 determine that fault report is accurate, the headend device 175 and/or AMI client 180 may be configured to open the switch 125 in phase conductor 115a. Furthermore, the headend device 175 and/or AMI client 180 will report the location of the fault to utility service technicians.

In some embodiments, the first fault detection algorithm is based on both the NG current 155a flow direction and magnitude as described in the above embodiments. In such embodiments, if the fault detection sensor 170a determines that both the fault condition associated with a reversal in flow direction of NG current 155a and the fault condition associated with a change in magnitude of NG current 155a are present, the fault detection sensor 170a may determine that a fault has occurred in the electrical grid system 100.

In some embodiments, execution of the first fault detection algorithm includes use of the following equation:

$$\text{Alarm} = \{\text{True, if } [MA(I_{NG}, q, t=0) > (MA(I_{NG}, q, t=T) + \text{Threshold}_{Rise})] \text{False otherwise}\} \quad \text{Equation 1}$$

where, "$I_{NG}$" is the NG current 155a, "MA" is a moving average function described in the first argument applied over a prior set of sample periods expressed as the second argument, at a point in time identified in the third argument. A typical value for "q" could be 60 samples cycles (1 second sample period), and for "T" a value of −3600 sample cycles (the previous 60 sample periods taken over the course of one minute).

Not all high impedance faults occurring within electrical grid system 100 are detected by a fault detection sensor 170 executing an embodiment of the first fault detection algorithm described above. Moreover, various types of high impedance faults, such as highly dangerous arcing faults and/or other intermittent faults, impact characteristics of the NG current 155 other than magnitude and flow direction, such as noise characteristics of the NG currents 155, and may go undetected by fault detection sensors 170 executing only the first fault detection algorithm. Thus, the fault detection sensors 170 may be further configured to execute a second fault detection algorithm that is used for the occurrence of the second type event associated with NG current 155, which is the occurrence of significant random noise on the NG wire 140a. As will be discussed below, detecting the presence of significant random noise associated with the NG current 155 enables the fault detection sensor 170 to determine whether an arcing fault is present in the electrical grid system 100. The second fault detection algorithm may be executed by any fault detection sensor 170 within the electrical grid system 100, for the second fault detection algorithm is based only on noise attributes of the NG current 155 and does not require information associated with a reference line current 127. For exemplary purposes, the second fault detection algorithm will be explained with respect to fault detection sensor 170a.

With reference to the electrical grid system 100, line current 127 flowing through the phase conductor 115a may experience an arcing fault in response to a variety of conditions (for example, equipment failure, environmental changes, etc.). When the line current 127 flowing through phase conductor 115a experiences an arcing fault, a portion of the line current 127, modeled as arc fault current 161, may intermittently arc from the phase conductor 115a to the ground 102. For example, arc fault current 161 may arc directly to the ground path 102 through the air or arc to and flow through nearby objects, such as trees or street signs, to the ground path 102. For exemplary purposes, the path taken by the arc fault current 161 to ground 102 is modeled as fault impedance 160. The fault current 161 exiting the fault impedance 160 may flow through the ground path 102 as it returns to the node 136 at transformer 105. As discussed above, the ground path 102 of electrical grid system 100 has a much higher resistance than that of the neutral line 135. Accordingly, the arc fault current 161 flowing through ground path 102 will tend to take the path of least resistance as it returns to node 136 at the transformer 105 by flowing from the ground path 102 to the neutral line 135 through the NG wires 140, such as NG wire 140a. Therefore, characteristics of the NG current 155a that is flowing through NG wire 140a may be affected by the arc fault current 161. However, since arcing occurs intermittently, changes in magnitude and direction of the NG current 155a caused by arc fault current 161 may not be detected by the first fault detection algorithms discussed above. Accordingly, the fault detection sensor 170a may execute the second fault detection algorithm to detect abnormalities in the noise attribute associated with NG current 155a flowing through NG wire 140a. In particular, the fault detection sensor 170a executing the second fault detection algorithm is configured to detect the occurrence of a significant random noise attribute of NG current 155a crossing an arc noise threshold and determine whether an arc fault has occurred in the electrical grid system 100.

In some embodiments, fault detection sensor 170a executing the second fault detection algorithm detects the occurrence of a significant random noise attribute associated with NG current 155a flowing through NG wire 140a by analyzing noise characteristics of the NG current 155a in the frequency domain. In particular, the second fault detection algorithm employs a function inspired by total harmonic distortion (THD), which will be referred to as total random harmonic distortion (TRHD). The TRHD function is employed with the intent to avoid the accumulation of periodic NG current 155a. Rather, the TRHD function accumulates only the random components of NG current 155a that may be attributed to arcing faults. It should be understood that the TRHD function is not limited to current detection applications that will be describe below, for the TRHD function may be used to identify the accumulation of random components present in any type of signal, such as an energy, voltage, or power signal.

When executing the second fault detection algorithm, the sensor controller 200 of fault detection sensor 170a is configured to analyze the NG current signals 231a received from the NG current sensor 230a in the frequency domain to determine a noise attribute NG current 155a. In particular, the sensor controller 200 calculates a noise attribute of the NG current 155a, such as the total random harmonic distortion present in the NG current 155a, by, in some embodiments, employing the TRHD Equations listed below:

$$TRHD_{I_f=120-3000\ Hz}^{cycle} = \frac{\sum_{H=2}^{50} \left| ((I_{f=H\times 60})^2 - (MA(I_{f=H\times 60}, q))^2)^{1/2} \right|}{|I_{f=60\ Hz}|} \quad \text{Equation 2}$$

With respect to Equation 2, $TRHD_I$ represents the total random harmonic distortion of NG current 155a over one cycle "c," wherein each cycle "c" creates a new sample of NG current 155a measurements expressed in the frequency domain $I_f$. In some embodiments, new samples of NG current 155a measurements are calculated in 60 Hz cycles; therefore, 60 samples of the $TRHD_I$ are calculated each second. "H" is the harmonic component (for example, second harmonic, third harmonic, etc.) of the NG current 155a. "MA" is a moving average of the $TRHD_I$ function expressed in the first argument (left side of equal sign) applied over a prior set of previously calculated $THRD_I$ NG current 155a samples. The averaging occurs over the previous "q" cycles (for example, 2 cycles). Accordingly, the $TRHD_I$ for one cycle is equal to a summation of the differences between the present harmonic component and the moving average value of previous harmonic components, for each harmonic component being considered (for example, the second through fiftieth harmonic as illustrated in Equation 1). Therefore, only random changes in the harmonic components of NG current 155a are summed and considered by the fault detection sensor 170a when determining whether an arcing fault is present in electrical grid system 100. Although Equation 2 is written above for a system having a fundamental frequency of 60 Hz that considers NG current 155a harmonics 2 through 50, Equation 2 may be utilized for systems having any fundamental frequency value (for example, 50 Hz) and may consider any number of harmonics (for example, 60).

$$\text{indication } TRHD_{I_f=120-3000\ Hz}^{T=3600\ cycles} = \left(\frac{3600}{T}\right)\sum_{cycle\ t=0}^{1-T} TRHD_{I_f=120-3000\ Hz}^{cycle} \quad \text{Equation 3}$$

With reference to Equation 3 above, an indicating $TRHD_I$ of NG current 155a is calculated by summing NG current 155a $TRHD_I$ samples (calculated with Equation 2 above) over some period of "T" current sample cycles (for example, T=3600 cycles, or equivocally, one minute of current sample cycles calculated at a rate of 60 Hz). The indicating $TRHD_I$ of NG current 155a is continually updated after each $TRHD_I$ cycle calculation (e.g., at a rate of 60 Hz). The sensor controller 200 compares the indicating $TRHD_I$ of NG current 155a to a configurable noise threshold, which may be determined during a self-normalization period of fault detection sensor 170a. If the sensor controller 200 determines that the indicating $TRHD_I$ of NG current 155a exceeds the configurable noise threshold, the sensor controller 200 determines that significant random noise is present in NG current 155a. Accordingly, the sensor controller 200 determines that an arc fault is present in electrical grid system 100 and reports the occurrence of the arc fault to the headend device 175 and/or AMI client 180. The headend device 175 and/or AMI client 180 may be configured to open switch 125 of phase conductor 115a upon receipt of the arc fault signal from fault detection sensor 170a.

In some embodiments, it may be desirable to calculate a filtered $TRHD_I$ of NG current 155a, which excludes all frequency components of NG current 155a that are below a cutoff threshold. For example, referring to Equations 4 and 5 below, it may be desirable to calculate the $TRHD_I$ using only the band pass harmonics within the 1.2-3 kHz range. Accordingly, in such embodiments, the second fault detection algorithm would calculate the $TRHD_I$ of NG current 155a using harmonics 10 through 50.

$$TRHD_{I_f=1200-3000\ Hz}^{cycle} = \frac{\sum_{H=20}^{50}\left|\left((I_{f=H\times 60})^2 - (MA(I_{f=H\times 60}, q))^2\right)^{1/2}\right|}{|I_{f=60\ Hz}|} \quad \text{Equation 4}$$

$$\text{indicating } TRHD_{I_f=1200-3000\ Hz}^{T=3600\ cycles} = \left(\frac{3600}{T}\right)\sum_{cycle\ t=0}^{1-T} TRHD_{I_f=1200-3000\ Hz}^{cycle} \quad \text{Equation 5}$$

In some embodiments of the fault detection sensor 170, the sensor controller 200 may be further configured to detect an occurrence of a third type event associated with the NG current 155 flowing through the NG wire 140 by executing a third fault detection algorithm. In such embodiments, the third type event is an absence of, or zero, NG current 155 flowing through an NG wire 140. An absence of NG current 155 flowing through an NG wire 140 may be indicative of the removal of an NG wire 140 from the electrical grid system 100. For example, a thief may remove an NG wire 140 from the electrical grid system 100 if the NG wire 140 is constructed of a valuable metal such as copper.

In such embodiments, while executing the third fault detection algorithm, the sensor controller 200 of fault detection sensor 170a is configured to monitor NG current signals 231a received from the NG current sensor 230a for an NG current 155a magnitude that is equal to zero amps (wherein zero amps may be equivalent of a current magnitude less than a zero current threshold, such as 0.1 milliamps). If the sensor controller 200 detects that zero NG current 155a is flowing along NG wire 140a, a third type event is raised and a fault timer is initiated. The fault timer continues to run when zero NG current 155a is flowing through NG wire 140a; however, if the magnitude value of NG current 155a surpasses the zero current threshold, the fault timer will shut off. The sensor controller 200 continues to compare the magnitude value of NG current 155a to the zero current threshold as the fault timer runs. If the magnitude value of NG current 155a remains less than the zero current threshold for an amount of time that exceeds a configurable fault threshold time (for example, 30 seconds), the sensor controller 200 determines that NG wire 140a has been removed from the electrical grid system 100. Accordingly, the fault detection sensor 170 reports the absence of NG wire 140a to the headend device 175 and/or AMI client 180, which in turn may open the switch 125 in phase conductor 115a.

In some embodiments, the fault detection sensor 170a may further be configured to detect the occurrence of a fourth type event associated with the electrical grid system 100 by executing a fourth fault detection algorithm. In such embodiments, the fourth type event is the occurrence of a distribution pole, which supports an overhead phase conductor 115, tilting past a predetermined threshold. The tilting of a distribution pole may be detected by an accelerometer included in the fault detection sensor 170a that is mounted on the distribution pole. If the fault detection sensor 170a determines that the distribution pole is tilting past a predetermined tilt threshold, the fault detection sensor 170a reports the excessive distribution pole tilt to the headend device 175 and/or AMI client 180. Accordingly, the headend device 175 and/or AMI client 180 may transmit instruction to straighten the pole to maintenance personnel, such as line technicians. For example, a distribution pole that is tilted past the predetermined tilt threshold may lean into nearby trees. Accordingly, the lineman may be ordered to straighten the distribution pole and service technicians may be ordered to trim the nearby trees.

What is claimed is:

1. An electrical grid system comprising;
a phase conductor;
a neutral conductor;
a neutral-to-ground conductor segmenting the neutral conductor and configured to conduct current flow between the neutral conductor and the ground; and
a fault detection sensor including:
a current sensor configured to sense current flowing along the neutral-to-ground conductor; and
a controller having an electronic processor, the controller configured to:
receive signals indicative of the current flowing through the neutral-to-ground conductor form the current sensor;
determine a noise attribute of the neutral-to-ground conductor based on the received signals; and output an occurrence of a fault in the electrical grid system when the noise attribute of the neutral-to-ground conductor exceeds a threshold.

2. The electrical grid system of claim 1, wherein the controller is further configured to monitor the received signals for the occurrence of at least one of a first type event and a second type event associated with the current flowing through the neutral-to-ground conductor.

3. The electrical grid system of claim 2, wherein the controller is further configured to:
monitor the received signals for the occurrence of the first type event by executing a first fault detection algorithm; and
monitor the received signals for the occurrence of the second type event by executing a second fault detection algorithm.

4. The electrical grid system of claim 3, wherein the controller is further configured to execute the first fault detection algorithm and the second fault detection algorithm simultaneously.

5. The electrical grid system of claim 2, wherein the first type event includes a reversal in a direction of current flow along the neutral-to-ground conductor from a normal direction to a reverse direction.

6. The electrical grid system of claim 5, wherein the controller is further configured to:
receive, from a second current sensor configured to sense a reference current flowing through the phase conductor, second signals indicative of the current flowing through the phase conductor; and
determine the direction of current flow along the neutral-to-ground conductor based on the received second signals.

7. The electrical grid system of claim 5, wherein the controller is further configured to determine that the fault has occurred when an amount of time for which the current flowing through the neutral-to-ground conductor flows in the reverse direction exceeds a first predetermined amount of time.

8. The electrical system of claim 5, wherein the first type event further includes an increase in magnitude of the current flowing through the neutral-to-ground conductor above a predetermined normal current threshold, wherein the controller is further configured to:
determine whether the magnitude of current flowing through the neutral-to-ground conductor has increased above the predetermined normal current threshold in an amount of time that is less than a second predetermined amount of time.

9. The electrical grid system of claim 2, wherein the second type event is the occurrence of significant random noise on the neutral-to-ground conductor indicative of an arcing fault.

10. A method for determining whether a fault has occurred in an electrical grid system comprising a phase conductor, a neutral conductor, a neutral-to-ground conductor segmenting the neutral conductor and configured to conduct current flow between the neutral conductor and ground, and a fault detection sensor including a current sensor and a controller having an electronic processor, the method comprising:
sensing, by the current sensor, current flowing along the neutral-to-ground conductor;
receiving, by the controller, signals indicative of the current flowing through the neutral-to-ground conductor from the current sensor;
determining, by the controller, a noise attribute of the neutral-to-ground conductor based on the received signals; and
reporting, by the controller, that a fault has occurred in the electrical grid system when the noise attribute of the neutral-to-ground conductor exceeds a threshold.

11. The method of claim 10, further comprising monitoring, by the controller, the received signals for the occurrence of at least one of a first type event and a second type event associated with the current flowing through the neutral-to-ground conductor.

12. The method of claim 11, further comprising:
monitoring, by the controller, the received signals for the occurrence of the first type event by executing a first fault detection algorithm; and
monitoring, by the controller, the received signals for the occurrence of the second type event by executing a second fault detection algorithm.

13. The method of claim 12, further comprising:
executing, by the controller, the first fault detection algorithm and the second fault detection algorithm simultaneously.

14. The method of claim 11, wherein the first type event includes a reversal in a direction of current flow along the neutral-to-ground conductor from a normal direction to a reverse direction.

15. The method of claim 14, further comprising:
receiving, by the controller, from a second current sensor configured to sense a reference current flowing through the phase conductor, second signals indicative of the current flowing through the phase conductor; and
determining, by the controller, the direction of current flow along the neutral-to-ground based on the received second signals.

16. The method of claim 14, further comprising:
determining, by the controller, that the fault has occurred when an amount of time for which the current flowing through the neutral-to-ground conductor flows in the reverse direction exceeds a first predetermined amount of time.

17. The method of claim 14, wherein the first type event further includes an increase in magnitude of the current flowing through the neutral-to-ground conductor above a predetermined normal current threshold, further comprising:
determining, by the controller, whether the magnitude of current flowing through the neutral-to-ground conductor has increased above the predetermined normal current threshold in less than a second predetermined amount of time.

18. The method of claim 11, wherein the second type event is the occurrence of significant random noise on the neutral-to-ground conductor indicative of an arcing fault.

19. A fault detection sensor comprising;
a current sensor configured to sense current flowing along a neutral-to-ground conductor included in an electrical grid system, the neutral-to-ground conductor segmenting a neutral line of the electrical grid system; and
a controller having an electronic processor, the controller configured to:
receive signals indicative of the current flowing through the neutral-to-ground conductor form the current sensor;
determine a noise attribute of the neutral-to-ground conductor based on the received signals; and
output an occurrence of a fault in the electrical grid system when the noise attribute of the neutral-to-ground conductor exceeds a threshold.

20. The fault detection sensor of claim 19, wherein the controller is further configured to monitor the received signals for the occurrence at least one of a first type event and a second type event associated with the current flowing through the neutral-to-ground conductor.

21. The fault detection sensor of claim 20, wherein the controller is further configured to:
monitor the received signals for the occurrence of the first type event by executing a first fault detection algorithm; and
monitor the received signals for the occurrence of the second type event by executing a second fault detection algorithm.

22. The fault detection sensor of claim 21, wherein the controller is further configured to execute the first fault detection algorithm and the second fault detection algorithm simultaneously.

23. The fault detection sensor of claim 20, wherein the first type event includes a reversal in a direction of current flow along the neutral-to-ground conductor from a normal direction to a reverse direction.

24. The fault detection sensor of claim 23, wherein the controller is further configured to:
receive, from a second current sensor configured to sense a reference current flowing through a phase conductor included in the electrical grid system, second signals indicative of the current flowing through the phase conductor; and
determine the direction of current flow along the neutral-to-ground conductor based on the received second signals.

25. The fault detection sensor of claim 23, wherein the controller is further configured to determine that the fault has occurred when an amount of time for which the current flowing through the neutral-to-ground conductor flows in the reverse direction exceeds a first predetermined amount of time.

26. The fault detection sensor of claim 23, wherein the first type event further includes an increase in magnitude of the current flowing through the neutral-to-ground conductor above a predetermined normal current threshold, wherein the controller is further configured to:
determine whether the magnitude of current flowing through the neutral-to-ground conductor has increased above the predetermined normal current threshold in an amount of time that is less than a second predetermined amount of time.

27. The fault detection sensor of claim 20, wherein the second type event is the occurrence of significant random noise on the neutral-to-ground conductor indicative of an arcing fault.

28. The electrical grid system of claim 1, wherein the neutral-to-ground conductor is provided on a supply-side of a substation.

29. The method of claim 10, wherein the neutral-to-ground conductor is provided on a supply-side of a substation.

30. The fault detection sensor of claim 19, wherein the neutral-to-ground conductor is provided on a supply-side of a substation.

* * * * *